(12) United States Patent
Mobley et al.

(10) Patent No.: US 9,236,274 B1
(45) Date of Patent: Jan. 12, 2016

(54) FILLING MATERIALS AND METHODS OF FILLING THROUGH HOLES FOR IMPROVED ADHESION AND HERMETICITY IN GLASS SUBSTRATES AND OTHER ELECTRONIC COMPONENTS

(71) Applicant: Triton Microtechnologies, Oro Valley, AZ (US)

(72) Inventors: Tim Mobley, Marana, AZ (US); Roupen Leon Keusseyan, Carlsbad, CA (US)

(73) Assignee: TRITON MICROTECHNOLOGIES, Oro Valley, AZ (US)

( * ) Notice: Subject to any disclaimer, the term of this patent is extended or adjusted under 35 U.S.C. 154(b) by 0 days.

(21) Appl. No.: 14/568,842

(22) Filed: Dec. 12, 2014

Related U.S. Application Data

(63) Continuation-in-part of application No. 13/666,089, filed on Nov. 1, 2012.

(60) Provisional application No. 61/985,697, filed on Apr. 29, 2014, provisional application No. 61/947,577, filed on Mar. 4, 2014, provisional application No. 61/554,417, filed on Nov. 1, 2011.

(51) Int. Cl.
| | |
|---|---|
| H01L 21/48 | (2006.01) |
| H05K 3/40 | (2006.01) |
| C03B 25/02 | (2006.01) |
| C03C 15/00 | (2006.01) |
| C03C 17/32 | (2006.01) |
| C03C 17/30 | (2006.01) |
| C03C 17/06 | (2006.01) |
| C03C 23/00 | (2006.01) |
| C03C 17/38 | (2006.01) |

(Continued)

(52) U.S. Cl.
CPC ............ H01L 21/486 (2013.01); C03B 25/025 (2013.01); C03C 15/00 (2013.01); C03C 17/06 (2013.01); C03C 17/30 (2013.01); C03C 17/32 (2013.01); C03C 17/38 (2013.01); C03C 23/0025 (2013.01); H01L 23/15 (2013.01); H05K 1/0306 (2013.01); H05K 3/4038 (2013.01); C03C 2217/25 (2013.01); C03C 2217/70 (2013.01); C03C 2218/31 (2013.01); C03C 2218/32 (2013.01)

(58) Field of Classification Search
CPC ............ H01L 23/5384; H01L 23/5226; H01L 23/49827; H01L 21/486; H01L 2224/0237; H01L 23/15; H05K 1/0306; H05K 3/4038
IPC .................. H01L 23/5384, 23/5226, 23/49827, H01L 21/486, 2224/0237
See application file for complete search history.

(56) References Cited

U.S. PATENT DOCUMENTS

| | | | | |
|---|---|---|---|---|
| 5,029,242 | A | * | 7/1991 | Sammet ................ C03C 14/004 156/89.28 |
| 5,260,519 | A | * | 11/1993 | Knickerbocker et al. .................... H01L 21/486 174/257 |
| 7,183,650 | B2 | | 2/2007 | Shiono |

(Continued)

*Primary Examiner* — Jose R Diaz

(57) ABSTRACT

A method of processing a glass substrate for use in semiconductor packaging applications. Through holes are created in a glass substrate and subsequently filled with a metallized paste material. The glass substrate is planarized after metallization to clean and flatten a surface of the glass substrate. The surface of the glass substrate is coated with at least one redistribution layer of a metal, a metal oxide, an alloy, a polymer, or a combination thereof. The paste material has improved adhesion to the through-holes. The filled through-holes are hermetic and have a low resistivity.

3 Claims, 7 Drawing Sheets

(51) Int. Cl.
*H01L 23/15* (2006.01)
*H05K 1/03* (2006.01)

(56) References Cited

U.S. PATENT DOCUMENTS

| | | | |
|---|---|---|---|
| 7,605,463 B2 * | 10/2009 | Sunohara et al. | 257/700 |
| 7,645,701 B2 * | 1/2010 | Anderson et al. | 438/675 |
| 8,411,459 B2 | 4/2013 | Yu | |
| 8,584,354 B2 | 11/2013 | Cornejo | |
| 2004/0217455 A1 * | 11/2004 | Shiono et al. | 257/678 |
| 2011/0108931 A1 | 5/2011 | Mohri | |
| 2011/0220925 A1 | 9/2011 | Greenwood | |
| 2012/0106117 A1 | 5/2012 | Sundaram | |
| 2013/0119555 A1 | 5/2013 | Sundaram | |
| 2013/0242493 A1 | 9/2013 | Shenoy | |
| 2013/0341653 A1 | 12/2013 | Yuan | |

* cited by examiner

FILLING MATERIALS AND METHODS OF FILLING THROUGH HOLES FOR IMPROVED ADHESION AND HERMETICITY IN GLASS SUBSTRATES AND OTHER ELECTRONIC COMPONENTS

CROSS REFERENCE

This application claims priority to U.S. Provisional Patent Application No. 61/947,577, filed Mar. 4, 2014, and U.S. Provisional Patent Application No. 61/985,697, filed Apr. 29, 2014, the specification(s) of which is/are incorporated herein in their entirety by reference.

This application claims priority to U.S. patent application Ser. No. 13/666,089, filed Nov. 1, 2012, which is a non-provisional of U.S. Provisional Patent Application No. 61/554,417, filed Nov. 1, 2011, the specification(s) of which is/are incorporated herein in their entirety by reference.

FIELD OF THE INVENTION

The present invention relates to a method of creating through-holes in glass substrates and filling the through-holes with materials to connect integrated circuits for use in electronic applications.

BACKGROUND OF THE INVENTION

Semiconductor devices are constantly responding to the market demand for faster, smaller, higher data and less expensive devices. Devices are expected to deliver more functionality at greater speeds in smaller dimensions and with capabilities of electrical and optical signals. This requires a new packaging scheme that can integrate heterogeneous devices such as logic, memory, power, graphics, sensors and other integrated circuits and components in a single package where improved electrical performance is also achieved by having these devices in close proximity.

Microscopic through-holes in a glass substrate are filled with materials that are usually metallized, and can act as connectors between the top and bottom surface of the glass substrate to transfer electronic signals and currents to semiconductor or other devices. Glass and glassy substrates include borosilicate, quartz, sapphire, and other substrates with, toughness, pressure sensitivity, thermal expansion, dielectric properties and transparency designed for specific applications.

The present invention provides a simple and low cost method that achieves excellent adhesion and hermeticity between the filling material and glass substrate.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

SUMMARY OF THE INVENTION

The present invention features a method of processing a glass substrate for use in semi-conductor applications. In some embodiments, the method comprises filling through-holes of the glass substrate with a metallized paste material using thick film technology, planarizing the glass substrate after metallization to clean and flatten a surface of the glass substrate, coating the surface of the glass substrate with at least one redistribution layer of a metal, a metal oxide, an alloy, a polymer, or a combination thereof.

The present invention also features a method of creating through-holes in a glass substrate. In some embodiments, the method comprises strengthening the glass substrate to increase durability during the hole creation and subsequent processes, treating a surface of the glass substrate with a protective layer, creating the hole in the glass substrate, and heat treating the glass substrate to repair damage from the hole creation process.

In some embodiments, the method comprises barrel-coating the hole with at least one layer, curing the coated hole, metallization of the hole and heat treating the glass substrate. In some embodiments, the method further comprises strengthening the glass substrate prior to barrel-coating to increase durability. In some embodiments, the method further comprises cleaning the glass substrate prior to filling.

In some embodiments, a paste material is used for filling a through-hole for improved adhesion and hermeticity in glass substrates. In some embodiments, the paste material comprises a metal, a glass frit composition, a solvent, a resin, and inert additives.

DESCRIPTION OF PREFERRED EMBODIMENTS

Creating Through-Holes

Figure 1:
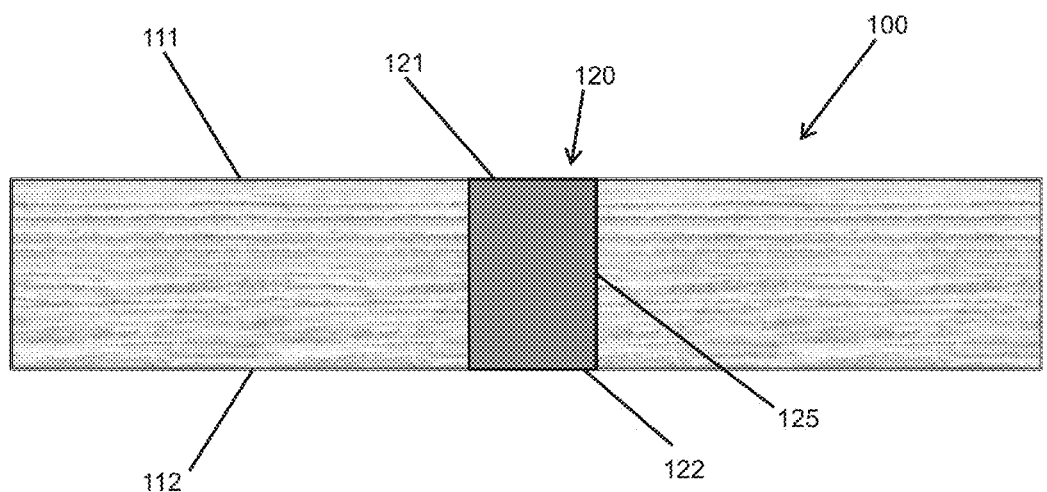
FIG. 1 shows a cross-sectional view of a glass substrate and filled through-hole of the present invention.

As used herein, the word "hole" and "through-hole" are used interchangeably. As used herein, the term "substantially" is defined as being largely that which is specified. As used herein, the term "partially" is defined as being to some extent, but no wholly, that which is specified. As used herein, the term "completely" is defined as being wholly or entirely that which is specified.

Referring now to FIGS. 1-10, the present invention features a method of creating through-holes in a glass substrate. In some embodiments, the method comprises strengthening the glass substrate to increase durability during the hole creation and subsequent processes, treating a surface of the glass substrate with a protective layer, creating the hole in the glass substrate, and heat treating the glass substrate to repair damage from the hole creation process.

In some embodiments, the glass substrate is strengthened by heating the glass substrate. In some embodiments, the heat treated by annealing the glass substrate.

In some embodiments, the protective layer catches debris and protects the surface during creation of the hole. In some embodiments, the protective layer is printed, laminated, sprayed or spin coated onto the glass substrate. In some embodiments, the protective layer comprises an organic material, such as Emulsitone or an equivalent material. In some embodiments, the protective layer is a polymer coating or a paste.

In some embodiments, the hole is created by etching the glass substrate. In some embodiments, the hole is dry etched into the glass substrate. In some embodiments, the hole is wet etched into the glass substrate. In some embodiments, the protective layer is a photopolymer, a photoresist, or a silicon based material or compound such as Silicon Nitride, which have all been imaged. In some embodiments, a portion of the protective layer is exposed to ultraviolet light to harden the photopolymer and prevent the hardened photopolymer from being etched or reversed based on positive or negative photoresist type. In some embodiments, the protective layer is developed to create holes on the surface of the glass substrate. In some embodiments, the hole is etched at least partially through the glass substrate thickness. In some embodiments, the hole is etched at completely through the glass substrate thickness. In some embodiments, the photopolymer is removed by a chemical solution after the hole is created. In some embodiments, the protective layer is applied to both sides of a glass wafer for purposes of etching holes in the glass In some embodiments, the hole is created by a laser. In some embodiments, the laser is applied to the surface of the glass substrate. In some embodiments, a wavelength of the laser is between 45 nm and 24 μm. In some embodiments, a pulse duration of the laser is between 1 femto second to 120 nanosecond. In some embodiments, the laser-created hole is chemically etched prior to filling. In some embodiments, a coating is applied to a glass surface prior to laser processing. In some embodiments, the coating comprises a polymer, film or paste which absorbs the wavelength of the laser, thereby reducing the level of heat required to create the hole in the glass. In some embodiments, the coating is subsequently removed after hole creation, either chemically or mechanically. The shape of the hole usually depends on the method and parameters used to create the hole.

Filling Through-Holes

The present invention features a method of filling a through hole in a glass substrate comprising coating a sidewall of the hole with at least one layer of coating material and metallizing the hole with the paste material. In some embodiments, the method comprises coating a sidewall of the hole with at least one layer of a paste material and thermally processing the coated hole prior to metallization. In some embodiments, the method comprises metallization of the through hole, followed by thermal processing. In some embodiments, the method further comprises strengthening the glass substrate prior to coating the sides of the holes for purposes of increased durability. In some embodiments, the method further comprises cleaning the glass substrate prior to filling.

In some embodiments, the glass substrate is heat treated by curing at a temperature between 40° C. and 815° C. for borosilicate glass and organic laminate materials and 40° C. to 1100° C. for synthetic quartz and ceramic based materials.

In some embodiments, heat treating the glass substrate achieves hermeticity and interconnection between inner and surface metallization layers.

In some embodiments, the coating on the sides of the hole is parallel to the direction of the through hole. In some embodiments, the hole is coated on the sides of the hole with an organometallic compound, such as silicon based compounds. In some embodiments, the hole is coated on the sides of the hole with a glass rich paste. In some embodiments, the coating on the sides of the hole is done by glass wetting. In some embodiments, the coating on the sides of the hole is done by reactive interaction with a surface of the hole. In some embodiments, the coating of the sides of the hole is thermal processed at a temperature between 40° C. and 815° C. for borosilicate glass materials.

In some embodiments, a first layer of coating the side of the hole is for adhesion promotion. In some embodiments, the subsequent layers are for conductivity and performance. In some embodiments, the performance is defined as the input and output of an electronic signal between the top surface and bottom surface of the glass substrate. In some embodiments, the performance is defined as the input and output of electrical power between the top surface and bottom surface of the glass substrate.

In some embodiments, the paste material comprises a metal, a glass frit composition, a solvent, a resin, a conductive or nonconductive inert additive, or mixtures thereof. In some embodiments, the paste material is a thick film paste containing a glass frit and a conductor. In some embodiments, the conductor is copper, silver, nickel or gold. In some embodiments, the hole is completely plated. In some embodiments, the hole is partially plated. In some embodiments, a conductive polymer is used to completely fill the hole. In some embodiments, the conductive polymer comprises a filler metal. In some embodiments, the filler metal is a pure metal compatible with the conductor. In some embodiments, the filler metal is a coated metal compatible with the conductor in some embodiments a silicon compound or adhesion promoter is in the paste. In some embodiments, the conductive polymer is cured in the 40° C. to 515° C. range to cause sintering and adhesion of the conductive polymer filler metal to the conductor in the hole itself or the wall of the hole. In some embodiments, a particle size of the metal ranges from 0.01 and 24 microns for D50 (fifty percentile particle size distribution).

In some embodiments, the hole is metallized by plating. In some embodiments, the hole is completely metallized by applying paste material comprising a thick film paste composition. In some embodiments, the hole is partially metallized by applying the paste material comprising a thick film paste composition. In some embodiments, the hole is further metallized by plating. In some embodiments, metallization completely fills the hole. In some embodiments, metallization partially fills the hole. In some embodiments, any remaining space in the hole is filled with a conductive polymer. In some embodiments, the conductive polymer comprises pure metal, coated particles or a mixture of pure and coated particles. In some embodiments, the polymer comprises a conductive metal curing material that is Cu and/or Ag and/or Au filled.

In some embodiments, the metal curing material that is thermally cured in the 40° C. to 515° C. using conductive particles with size in the 0.01 to 24 micron range for D50 (fifty percentile particle size distribution). In some embodiments, the conductive polymer is cured using UV or equivalent wavelength exposure, or a combination of UV exposure and thermal, or thermal curing completely. In some embodiments, an outer surface of a conductive particle is Cu and/or Ag, and/or Au. In some embodiments, the core of the conductive particles is different compared to the outer surface.

Paste Material

The present invention features a paste material for filling a through-hole for improved adhesion and hermeticity in glass substrates. In some embodiments, the paste material comprises a metal, a glass frit composition, a solvent, a resin, a conductive or non-conductive inert additive, or mixtures thereof. In some embodiments, the paste material comprises mixtures of metals, mixtures of glass frit compositions, mixtures of solvents, mixtures of resins, and mixtures of conductive or non-conductive inert additives.

As defined by the Department of Defense's test method standards for seals, hermeticity is the effectiveness of the seal of microelectronic and semi-conductor devices with designed internal cavities. The failure criteria for hermeticity vary depending on the application and are defined by the Department of Defense's test method standards for seals.

As defined herein, the term "improved adhesion" is metallization lift-off over about 1 Newton. Poor adhesion is metallization lift-off at or below about 1 Newton. Standard adhesion peel methods (Dupont H-02134) or wire soldering into fired pads may be included.

In some embodiments, the metal comprises a pure metal. In some embodiments, the metal comprises a metal compound. In some embodiments, the metal is combined with oxides and compounds of the metal and mixtures thereof. In some embodiments, the metal comprises copper, silver, gold, nickel, tungsten, molybdenum, silicon, aluminum, zinc, barium, boron, bismuth, titanium, metal compounds, or and a combination thereof. In some embodiments, the particle size of the metal powder ranges from 0.01 to 24 microns for D50 (fifty percentile particle size distribution). In some embodiments, a combination of powders with different particle sizes and shapes can be mixed for through hole filling applications.

In some embodiments, the metal comprises of a coated particle. In some embodiments, the metal comprises a conductive powder, wherein the conductive powder comprises a core, and wherein the core is coated with copper, silver, gold, nickel, tungsten, molybdenum, silicon, aluminum, zinc, barium, boron, bismuth, titanium, or a combination thereof.

In some embodiments, the glass frit composition comprises a mixture of glass frits. In some embodiments, the glass frit composition comprises the oxide and compounds of the following materials: Ag, Al, B, Bi, Ce, Cu, Co, F, Pb, Al, Zn, Zr, Si, Ba, Ru, Sn, Te, Ti, V, Na, K, Li, Ca, and P. The particle size of the glass frit to be in the 0.01 to 24 micron range for D50 (fifty percentile particle size distribution).

In some embodiments, the solvent comprises Terpineol, Texanol, Dowanol, butyl carbitol, butyl carbitol acetate, methyl-ethyl-butyl ethers, similar solvents used in thick film technology for curing or firing applications, or a combination thereof.

In some embodiments, the resin comprises ethyl cellulose based compositions and mixtures. In some embodiments, the resin comprises resin systems similar to ethyl cellulose based compositions and mixtures. In some embodiments, the resin is natural, synthetic or a combination thereof. The resin is normally dissolved using an appropriate solvent to produce a vehicle, with a viscosity like honey. The vehicle system is used to disperse the various ingredients in a thick film paste for printing, patterning and through hole filling applications.

In some embodiments, the inert additive comprises tungsten, molybdenum, aluminum, zinc, zirconium, silicon, lanthanum, ruthenium, cobalt, nickel, their compounds and oxides, or a combination thereof.

In some embodiments, the paste material is mixed and dispersed using a three roll mill and/or other approaches, typical in thick film technology, or a combination thereof. In some embodiments, the paste material fills the hole by printing, extrusion, dispensing, coating, injection or a combination thereof. In some embodiments, the filled hole is cured and/or fired in an air, nitrogen, doped nitrogen, $CO/CO_2$, vacuum, other inert environments or a combination of thereof.

Processing Glass Substrates

The present invention features a method of processing a glass substrate for use in semi-conductor packaging applications. In some embodiments, the method comprises filling through-holes of the glass substrate with a metallized paste material using thick film technology, planarizing the glass substrate after metallization to clean and flatten a surface of the glass substrate, coating the surface of the glass substrate with at least one redistribution layer of a metal, a metal oxide, an alloy, a polymer, or a combination thereof.

In some embodiments, the redistribution layer is a metal filled conductive polymer that is cured in the 40° C. and 515° C. temperature range. In some embodiments, the redistribution layer is plated for improved performance and functionality. In some embodiments, the plating material comprises one or a combination of materials, including Ni, Cu, Ag, Au, Pd, Pb, and Sn as major components.

In some embodiments, the redistribution layer is spin-coated onto the glass surface. In some embodiments, the redistribution layer is sprayed, screened or laminated onto the glass surface. In some embodiments, the redistribution layer is deposited using thick film technology. In some embodiments, the redistribution layer is deposited using thin film technology.

In some embodiments, thick film technology uses pastes containing glass frits that are deposited in patterned layers defined by screen printing and fused at high temperature onto a glass substrate. The paste is applied onto a substrate, or through hole filled, and the paste is subsequently cured and/or fired, the firing temperature being in the range of 40° C. and 815° C. The paste ingredients (for a conductor) are particles of metal, glass frit, additives, oxides, etc, dispersed in a vehicle system. Thick film technology is apparent to those ordinarily skilled in the art.

In some embodiments, in thin film technology, a metal is evaporated or deposited on a substrate, and then a photoresist is applied, and then exposed and developed to expose areas to be etched. The remaining deposited metallization (after etching the unwanted areas) constitutes the desired circuitry. The thin film deposited layer might contain several different metallizations layers for adhesion, barrier and passivation. In some embodiments, in thin film technology, an adhesion layer is deposited onto the glass substrate. In some embodiments, the adhesion layer is usually tungsten, titanium, chromium or a combination thereof. In some embodiments, the adhesion layer is followed by a metal layer. In some embodiments, the metal layer is copper, gold, or silver. In some embodiments, a diffusion barrier is deposited on the metal layer. In some embodiments, the diffusion barrier is nickel, tungsten, titanium, or chromium. In some embodiments, the diffusion barrier is followed by a passivation layer to protect the other layers from oxidation. In some embodiments, the passivation layer is nickel or gold. Thin film technology is apparent to those ordinarily skilled in the art.

In some embodiments, the method further comprises firing the glass substrate. In some embodiments, the glass substrate is fired at a temperature between 385° C. and 959° C. In some embodiments, the method further comprises curing the glass substrate. In some embodiments, the glass substrate is cured at a temperature between 40° C. and 515° C.

In some embodiments, the coated surface is cured in neutral or reducing atmospheres. In some embodiments, the coated surface is cured in air, nitrogen, or in a vacuum. In some embodiments, the coated surface is cured in doped atmospheres for higher performance.

Final Product

Figure 2:
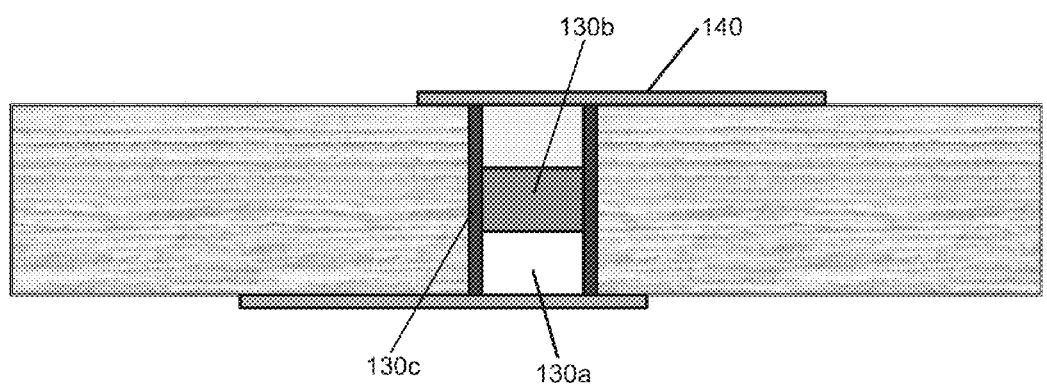
FIG. 2 shows a cross-sectional view of an alternative embodiment of the present invention.
Figure 3A:
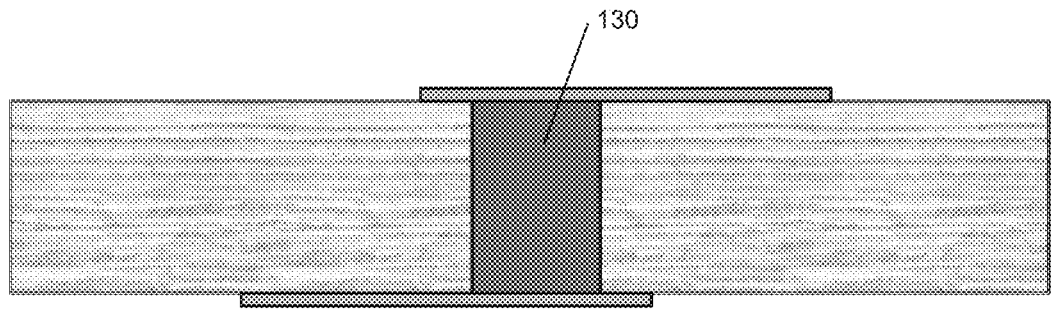
FIGS. 3A-3E show cross-sectional views of alternative embodiments of the present invention.
Figure 3B:
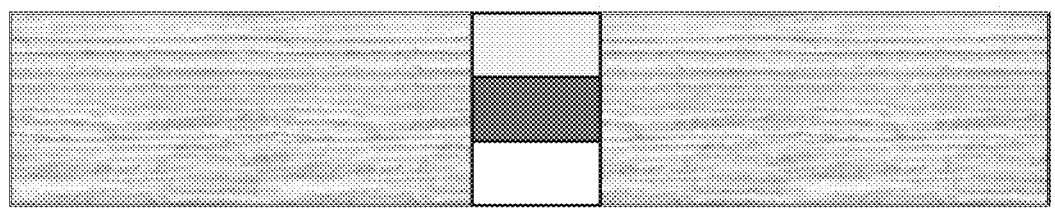
Figure 3C:
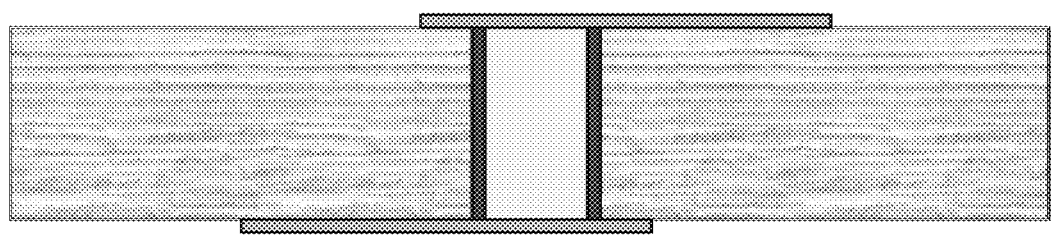
Figure 3D:
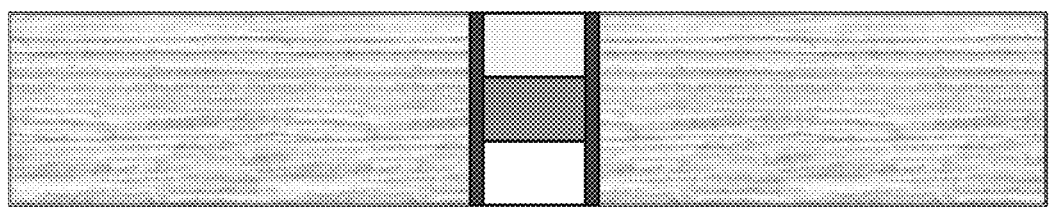
Figure 3E:
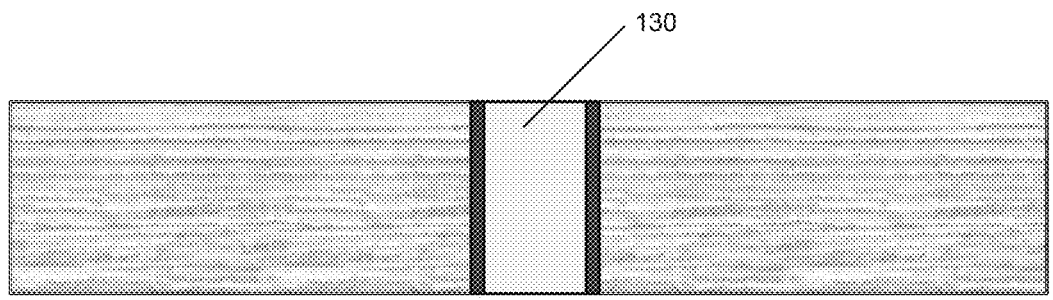
Figure 4:
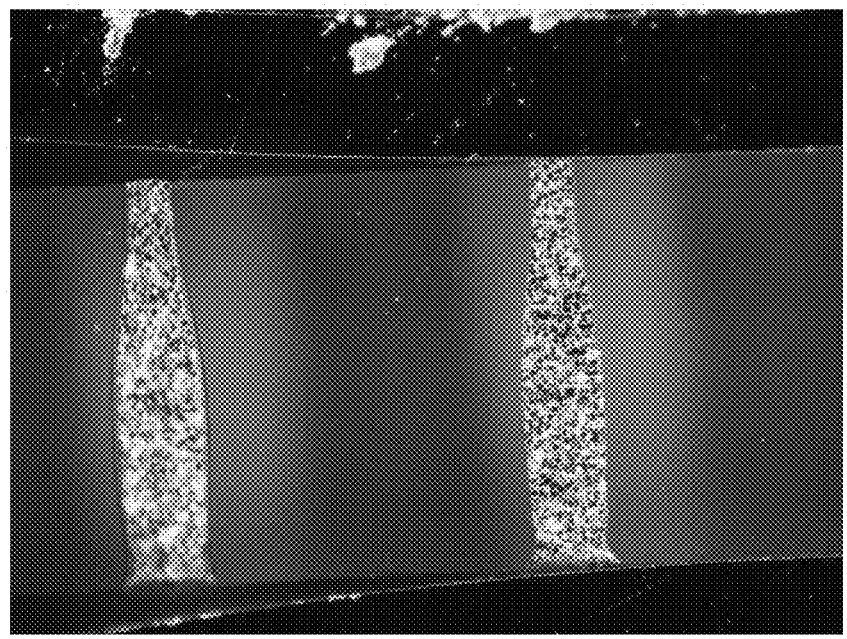
FIG. 4 shows a cross-sectional view of a glass substrate and filled through-hole of the present invention.
Figure 5:
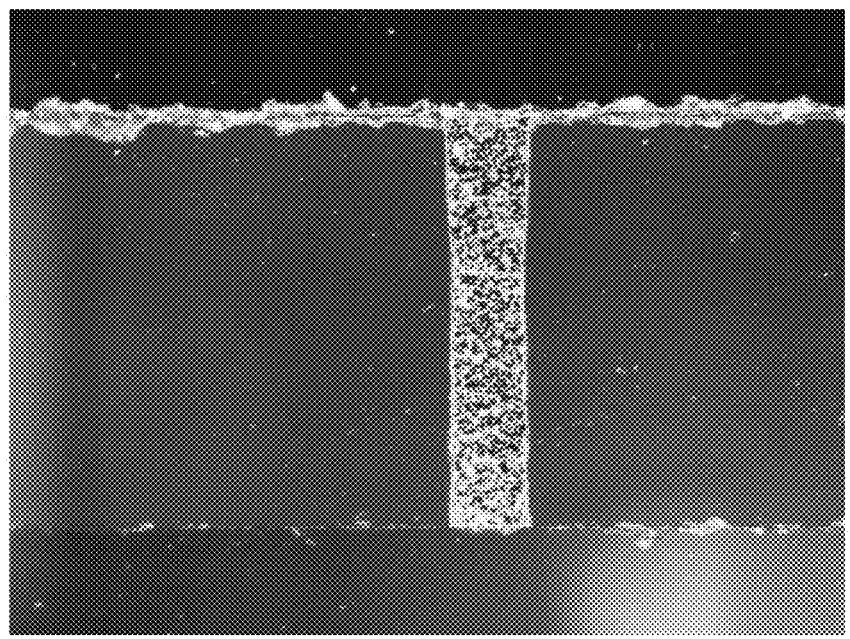
FIG. 5 shows a cross-sectional view of a glass substrate and filled through-hole of the present invention.
Figure 6:
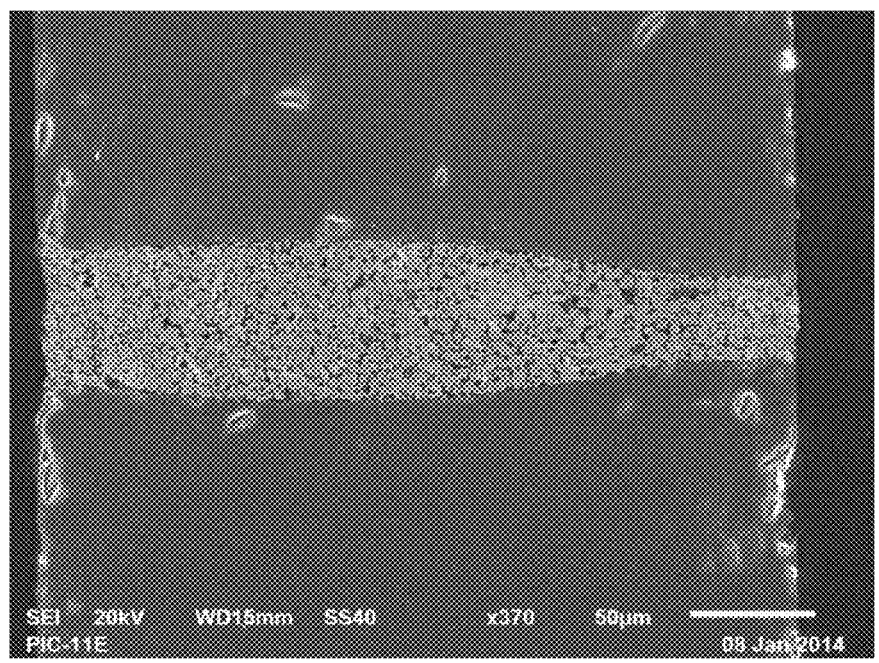
FIG. 6 shows a cross-sectional view of a filled through-hole of the present invention.
Figure 7:
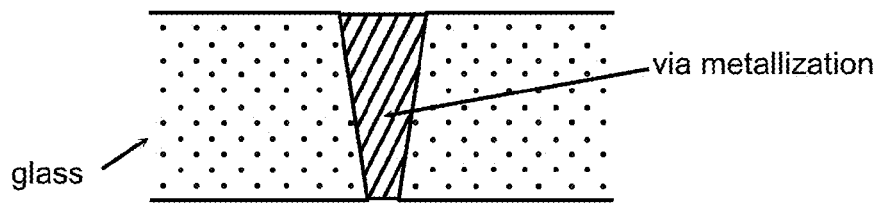
FIG. 7 shows a schematic of the cross-sectional view of a metallized through-hole of the present invention.
Figure 8:
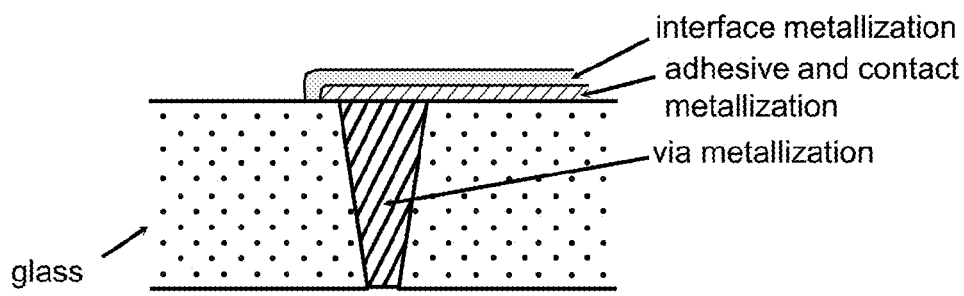
FIG. 8 shows a schematic of the cross-sectional view of redistribution layers disposed on a surface of the glass substrate and a metallized through-hole of the present invention.
Figure 9:
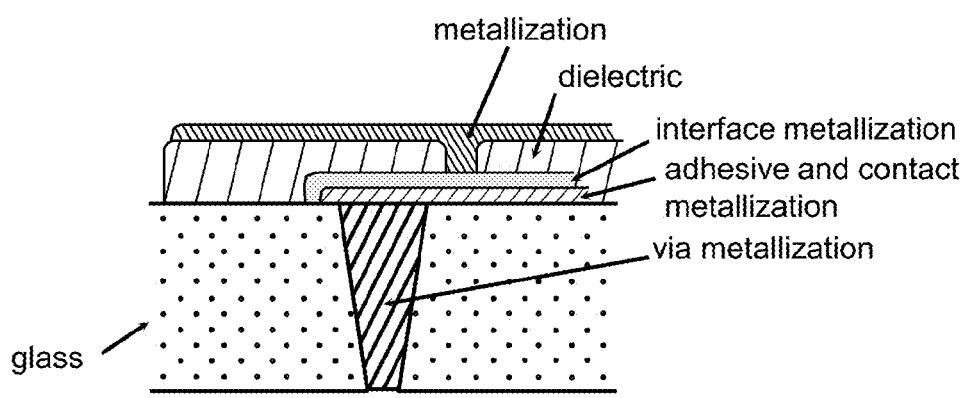
FIG. 9 shows a schematic of the cross-sectional view of redistribution layers disposed on a surface of the glass substrate and a metallized through-hole of the present invention.
Figure 10:
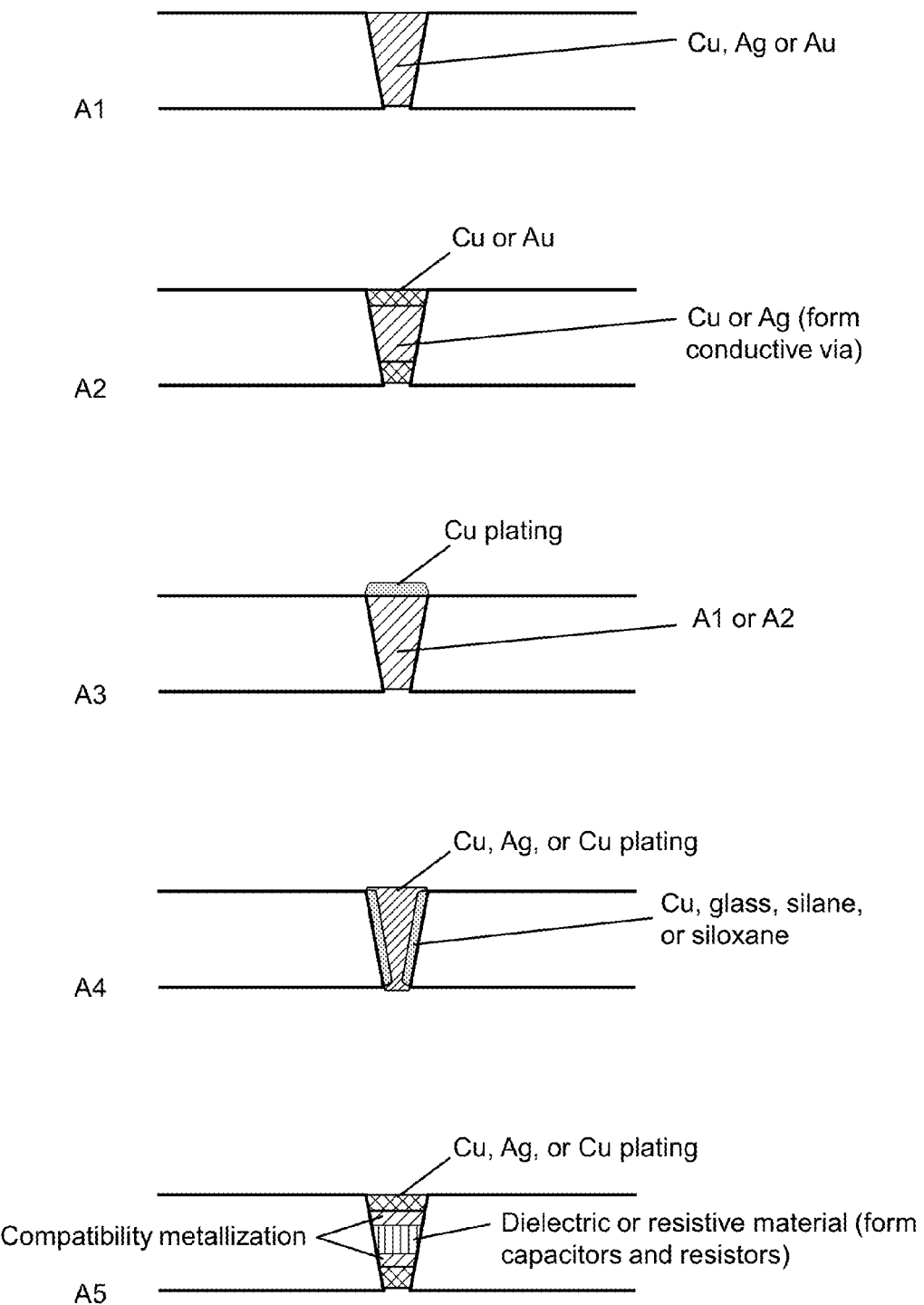
FIG. 10 shows a schematic of alternative embodiments of a filled-through hole of the present invention.

As seen in FIGS. 1 and 2, the present invention features a glass substrate (100) for use in semi-conductor packaging applications, said glass substrate (100) comprising a top surface (111) and a bottom surface (112), a through-hole (120) extending from the top surface (111) to the bottom surface (112) of the glass substrate (100), wherein the hole (120) comprises a first end (121), a second end (122), and a sidewall (125).

In some embodiments, at least one interior layer (130) disposed inside the hole (120). In some embodiments, at least one external layer (140) disposed on the top surface (111). In some embodiments, at least one external layer (140) disposed on the bottom surface (112). In some embodiments, the interior layer (130) comprises at least one metallized layer. In some embodiments, the metallized layer comprises at least one metallized paste composition. In some embodiments, the hole (120) is substantially filled with at least one metallized paste composition. In some embodiments, at least one metallized layer substantially occupies the volume of the hole. (120) after firing and curing the glass substrate (100).

In one preferred embodiment, the glass substrate comprises a plurality of though-holes, wherein each through-hole comprises a first end, a second end, and a sidewall. At least one interior layer is disposed inside each through-hole. The plurality of through-holes is each substantially filled with at least one metallized paste composition. At least one metallized layer substantially occupies the volume of each hole after firing and curing the glass substrate.

In some embodiments, a plurality of interior layers (130a, 130b, 130c) is disposed inside the hole. In some embodiments, a plurality of external layers (140) is disposed on the top surface (111). In some embodiments, a plurality of external layers (140) is disposed on the bottom surface (112). In some embodiments, each interior layer (130) comprises at least one metallized layer. In some embodiments, each interior layer (130) comprises a plurality of metallized layers. In some embodiments, each metallized layer comprises at least one metallized paste composition. In some embodiments, each metallized layer comprises a plurality of metallized paste compositions. In some embodiments, each hole (120) is substantially filled with at least one metallized paste composition. In some embodiments, each hole (120) is substantially filled with a plurality of metallized paste compositions. In some embodiments, at least one metallized layer substantially occupies the volume of each hole (120) after firing and curing the glass substrate (100). In some embodiments, a plurality of metallized layers substantially occupies the volume of each hole (120) after firing and curing the glass substrate (100).

In some embodiments, the top surface (111), bottom surface (112), and the interior layer (130) are at a same level. In some embodiments, the interior layer (130) is polished to remove any protruding metallization. In some embodiments, the top surface (111) and bottom surface (112) are polished off to be at the same level as the interior layer (130).

In some embodiments, the hole (120) is at least partially filled using thick film technology. In some embodiments, the hole (120) is at least partially filled by plating. In some embodiments, the hole (120) is plated at the first end (121), the second end (122), or a combination thereof.

In some embodiments, an inner metallized layer differs in composition from an outer metallized layer. In some embodiments, the hole (120) plating is metal. In some embodiments, the metal is copper, silver, gold, nickel, palladium or a combination thereof. In some embodiments, the hole (120) is a polymer conductive thick film. In some embodiments, the polymer conductive thick film is cured in a temperature between 40° C. and 515° C.

In some embodiments, the interior layer (130) comprises a copper thick film entirely, a silver thick film, and a copper thick film partially. In some embodiments, the interior layer (130) comprises a copper thick film and plated copper. In some embodiments, the interior layer (130) comprises plated copper, thick film copper, and plated copper. In some embodiments, the interior layer (130) comprises plated copper, thick film silver, and plated copper. In some embodiments, the interior layer comprises a copper layer, a silver layer, an electronic component, another silver layer, and another copper layer.

In some embodiments, the electronic component is disposed in the interior layer (130). In some embodiments, the electronic component is a capacitor. In some embodiments, the electronic component is a resistor. In some embodiments, an electronic component material comprises compounds or oxides of Ba, Bi, Ti, Sr, Ru, C, Ni, Fe, Pb, Al, Ca, Cu, Cr, Ag, Zn, Zr, V, or mixtures thereof. In some embodiments, when a conductor is a conductive polymer, the electronic component material is an organic polymer. In some embodiments, the organic polymer comprises compounds or oxides of Ba, Bi, Ti, Sr, Si, Ru, Ti, C, Ni, Fe, Pb, Al, Ca, Cu, Cr, Ag, Zn, Zr, V, or mixtures thereof.

In some embodiments, the sidewall (125) is coated. In some embodiments, the coating is copper, silver, gold, glass, silicon compounds, or a combination thereof.

In some embodiments, the filled hole (120) is hermetic. In some embodiments, the filled hole (120) has a high conductivity. In some embodiments, the filled hole (120) has a low resistivity. In some embodiments, the resistivity is less than 25 milli-ohm/square. In some embodiments, the resistivity is less than 20 milli-ohm/square. In some embodiments, the resistivity is less than 15 milli-ohm/square. In some embodiments, the resistivity is less than 10 milli-ohm/square. In some embodiments, the resistivity is less than 5 milli-ohm/square. In some embodiments, the resistivity is less than 3 milli-ohm/square. In some embodiments, the resistivity is less than 2 milli-ohm/square. In some embodiments, the resistivity is less than 1 milli-ohm/square.

In some embodiments, the glass substrate of the present invention can be used for eliminating flex cables for displays. In some embodiments, the glass substrate of the present invention can be used for transparent screen displays, CMOS sensors, optical signals, etc. In some embodiments, the glass substrate of the present invention can be used for in biomedical applications such as lab on a chip or DNA sequencing slides or other glass slides used for applying bio materials for testing.

In some embodiments, the hole is polished prior to or after filling the hole. In some embodiments, the hole is polished from one or both sides of the glass surface to produce a more uniform hole. In some embodiments, the hole may be cylindrical, conical, or varying in diameter throughout the hole.

In some embodiments, a separate metallization structure is attached and/or stacked to the metallized glass substrate from one or both sides. In some embodiments, the separate metallization structure could be another glass based structure, a high temperature co-fired (HTCC) or low temperature co-fired (LTCC) ceramic, a silicon or other semi-conductor structures, a flex circuit or a printed wiring board. In some embodiments, the thickness of the attached and/or stacked structure could have openings to accommodate devices attached to other glass substrates or stack layers.

As used herein, the term "about" refers to plus or minus 10% of the referenced number.

EXAMPLES

Example 1

As a non-limiting example, a $CO_2$ laser is used to drill through holes in a glass substrate.

Example 2

The following is a non-limiting example of filling a through-hole in a glass substrate. A thick film paste is used to fill the through hole. The paste is dried at or below 150° C. in air, nitrogen, doped nitrogen, $CO/CO_2$ or vacuum. The filled through hole is then fired up to 815° C., or below the softening point of the glass substrate. This process can be repeated several times depending on through hole dimensions. In some embodiments, firing above the softening point of the glass substrate (above 815° C. for borosilicate type glass) without a support can cause the glass substrate to warp, and/or the glass substrate can conform to a desired shape, which may be useful in specialized applications.

Example 3

The following is a non-limiting example. A method of processing a glass substrate for use in semi-conductor applications: The glass substrate with conductive through holes is metallized on both surfaces. Multiple layers, such as redistribution layers can be used based on the application. In one embodiment, integrated circuits and components are attached on one side, and a motherboard (PWB or other) is attached on the other side.

Example 4

Non-limiting example of a Paste Material—Organic vehicles based on ethyl cellulose or other resin systems; solvents including terpineol, dowanol, texanol and other solvent systems typically used in the thick film industry; glass frit compositions; copper powders and their oxides.

Example 4

Non-limiting example of a Final Product—Either thick film metallization (by itself or +plating), or thin film metallization with adhesion layer, barrier, conductor, barrier and ENIG or ENIPIG.

The disclosures of the following U.S. patents are incorporated in their entirety by reference herein: U.S. Pat. No. 8,584,354, U.S. 2013/0105211, WO2013138452, WO2012061304, U.S. Pat. No. 8,411,459, and U.S. 2013/0119555.

Various modifications of the invention, in addition to those described herein, will be apparent to those skilled in the art from the foregoing description. Such modifications are also intended to fall within the scope of the appended claims. Each reference cited in the present application is incorporated herein by reference in its entirety.

Although there has been shown and described the preferred embodiment of the present invention, it will be readily apparent to those skilled in the art that modifications may be made thereto which do not exceed the scope of the appended claims. Therefore, the scope of the invention is only to be limited by the following claims. Reference numbers recited in the claims are exemplary and for ease of review by the patent office only, and are not limiting in any way. In some embodiments, the figures presented in this patent application are drawn to scale, including the angles, ratios of dimensions, etc. In some embodiments, the figures are representative only and the claims are not limited by the dimensions of the figures. In some embodiments, descriptions of the inventions described herein using the phrase "comprising" includes embodiments that could be described as "consisting of", and as such the written description requirement for claiming one or more embodiments of the present invention using the phrase "consisting of" is met.

The reference numbers recited in the below claims are solely for ease of examination of this patent application, and are exemplary, and are not intended in any way to limit the scope of the claims to the particular features having the corresponding reference numbers in the drawings.

What is claimed:

1. A method of filling a through hole in a glass substrate, said method comprising:
   a. coating a sidewall of the hole with at least one layer of coating material, wherein the coating is parallel to the direction of the through hole, wherein the coating material comprises an organometallic compound or a glass rich paste; and
   b. metallizing the hole with a paste material, wherein the paste material comprises a metal, a glass frit composition, a solvent, a resin, and a non-conductive inert additive.

2. A method of filling a through hole in a glass substrate, said method comprising:
   a. coating a sidewall of the hole with at least one layer of coating material, wherein the coating is parallel to the direction of the through hole, wherein the coating material comprises an organometallic compound or a glass rich paste; and
   b. metallizing the hole with a paste material, wherein the paste material is a thick film paste containing a glass frit and a conductor.

3. A method of filling a through hole in a glass substrate, said method comprising:
   a. coating a sidewall of the hole with at least one layer of coating material, wherein the coating is parallel to the direction of the through hole, wherein the coating material comprises an organometallic compound or a glass rich paste;
   b. metallizing the hole with a paste material; and
   c. filling the hole with a conductive polymer.

* * * * *